United States Patent
Di Cioccio et al.

(10) Patent No.: US 7,981,238 B2
(45) Date of Patent: *Jul. 19, 2011

(54) METHOD FOR RELAXING A STRESSED THIN FILM

(75) Inventors: Lea Di Cioccio, Saint Ismier (FR); Damien Bordel, Grenoble (FR); Genevieve Grenet, Lyons (FR); Philippe Regreny, Chasselay (FR)

(73) Assignee: Commissariat a l'Energie Atomique, Paris (FR)

( * ) Notice: Subject to any disclaimer, the term of this patent is extended or adjusted under 35 U.S.C. 154(b) by 422 days.

This patent is subject to a terminal disclaimer.

(21) Appl. No.: 12/158,178

(22) PCT Filed: Dec. 26, 2006

(86) PCT No.: PCT/EP2006/070211
§ 371 (c)(1),
(2), (4) Date: Jun. 19, 2008

(87) PCT Pub. No.: WO03/081664
PCT Pub. Date: Oct. 2, 2003

(65) Prior Publication Data
US 2008/0271835 A1    Nov. 6, 2008

(30) Foreign Application Priority Data
Dec. 27, 2005 (FR) ..................... 05 54110

(51) Int. Cl.
*B32B 7/04* (2006.01)
(52) U.S. Cl. .......... 156/247; 156/344; 156/91; 428/426; 438/691; 438/458; 438/479; 438/977
(58) Field of Classification Search .................. 156/247, 156/91; 428/426; 438/691, 458, 479, 977
See application file for complete search history.

(56) References Cited

U.S. PATENT DOCUMENTS
5,856,229 A * 1/1999 Sakaguchi et al. ............ 438/406
(Continued)

FOREIGN PATENT DOCUMENTS
EP    1 014 452 A1    6/2000
(Continued)

OTHER PUBLICATIONS

Bowden N, Brittain S, Evans AG, Hutchinson JW, Whitesides GM, "Spontaneous formation of ordered structures in thin films of metals supported on an elastomeric polymer", May 1998, Nature, vol. 393, pp. 146-149.*

(Continued)

*Primary Examiner* — Kahnh Nguyen
*Assistant Examiner* — Keith T Aziz
(74) *Attorney, Agent, or Firm* — Oblon, Spivak, McClelland, Maier & Neustadt, L.L.P.

(57) ABSTRACT

A method relaxing a strained thin film, secured via a first main face of an initial support, the second main face of the thin film being a contact face. The method supplies an intermediate support including a polymer layer having a main free contact face, the polymer's thermal expansion coefficient being greater than that of the thin film, adhesively brings into contact the contact face of the strained thin film with the contact face of the polymer layer, eliminates the initial support, realizing relaxation of the thin film through formation of wrinkles and revealing the first main face of the thin film, increases the polymer layer temperature to stretch the relaxed thin film and eliminate the wrinkles, secures the first main face of the thin film with one face of a receiving substrate, and eliminates the intermediate support to obtain a relaxed thin film integral with the receiving substrate.

18 Claims, 2 Drawing Sheets

U.S. PATENT DOCUMENTS

| | | | |
|---|---|---|---|
| 6,071,795 A * | 6/2000 | Cheung et al. | 438/458 |
| 6,214,733 B1 * | 4/2001 | Sickmiller | 438/691 |
| 6,632,314 B1 | 10/2003 | Yu et al. | |
| 2001/0003668 A1 * | 6/2001 | Yanagita et al. | 438/455 |
| 2004/0239827 A1 | 12/2004 | Yamazaki et al. | |
| 2005/0016217 A1 | 1/2005 | Takakuwa et al. | |
| 2005/0020032 A1 * | 1/2005 | Solanki et al. | 438/458 |
| 2007/0117258 A1 | 5/2007 | Moriceau et al. | |

FOREIGN PATENT DOCUMENTS

| | | |
|---|---|---|
| EP | 1 041 624 A1 | 10/2000 |
| WO | WO 03/81664 A2 | 10/2003 |

OTHER PUBLICATIONS

M. Kostrzewa, et al., "Feasibility of Strain Relaxed InAsP and InGaAs Compliant Substrates", 2003 International Conference Indium Phosphide and Related Materials, XP 010746758, May 12, 2003, pp. 437-440.

Michael F. Ashby, "Material Selection in Mechnical Design", Pergamon Press, 2005 ISBN: 0750661682, 4 pages.

Hanging Jiang, et al., "Finite deformation mechanics in buckled thin films on compliant supports", PNAS, vol. 104, No. 40, Oct. 2, 2007, pp. 15607-15612.

* cited by examiner

METHOD FOR RELAXING A STRESSED THIN FILM

TECHNICAL FIELD

The invention concerns a method for relaxing a strained thin film. It concerns in particular the field of semi-conductors and particularly thin films obtained by epitaxy.

STATE OF THE PRIOR ART

Microelectronic and optoelectronic components are now produced from combinations of monocrystalline materials elaborated by epitaxy techniques. Modern epitaxy techniques enable materials of very high purity having properties close to their ideal theoretical performance to be prepared and combined.

Nevertheless, a certain number of technological barriers are holding up the full development of these techniques. Indeed, in the case of applications in optoelectronics, semiconductor alloys cover a very wide domain of composition and therefore of associated wavelengths and applications. However, the monocrystalline character of the substrates and the use of epitaxy techniques lead to restrictive intrinsic limitations since it is only possible a priori to combine materials having identical or very similar lattice parameters. In fact, depending on the substrates available, only narrow domains of composition may be exploited.

The solution often adopted to get round this problem has been to grow by heteroepitaxy alloys having a lattice mismatch on a standard substrate. These alloys are then strained. Beyond a thickness known as critical (of several nm), the strain energy leads to the plastic relaxation of the epitaxied layer. The outcome is the appearance of extensive structural defects (low mismatch) or a growth by islands (high mismatch). This relaxation mode leads to a roughening of the surface and therefore a deterioration of the optical and electronic properties of the materials.

Faced with this situation, the concept of "compliant substrate" was proposed by Y. H. LO in 1991 to enable lattice parameter mismatched layers to be formed. It involves a substrate that is going to be adapted to the lattice parameter of the layer that is epitaxied on it to avoid generation of defects in this layer linked to the relaxation of mismatch stresses. Reference may be made in this respect to the article "New approach to grow pseudomorphic structures over the critical thickness" of Y. H. LO, Appl. Phys. Lett. 59 (18), pages 2311 to 2313, 28 Oct. 1991.

The original approach consists in considering a thin substrate, of thickness less than the critical thickness so as to avoid plastic relaxation. This substrate deforms elastically (without crystalline defects) during the growth by spreading out the elastic energy between the substrate and the epitaxial layer, in order to progressively adapt its lattice parameter to that of the growing layer. It ensues from this concept that the substrate must be free to deform.

A similar approach consists in epitaxying a strained layer on a substrate then relaxing this layer to enable a resumption of epitaxy without generation of structural defects. The relaxation takes place before the resumption of epitaxy. This relaxation may be obtained by different methods such as subetching (see article "High-quality fully relaxed $In_{0.65}Ga_{0.35}As$ layers grown on InP using the paramorphic approach" of J. F. DAMLENCOURT et al., Appl. Phys. Lett. 75 (23), pages 3638 to 3640, 8 Dec. 1999) or a bonding on a viscous layer (see the article "Strain relaxation of SiGe islands on compliant oxide" of H. YIN et al., J. Appl. Phys., Vol. 91, No. 12, pages 9716 to 9722, 15 June 2002).

This latter approach is the most promising. The article cited of YIN et al. discloses its application through the use of borophosphosilicate (BPSG) glass. The article "Feasibility of III-V on-silicon strain relaxed substrates" of M. KOSTRZEWA et al., Journal of Crystal Growth 275 (2005), pages 157 to 166 discloses its application through the use of a wax. The strained layer, once freed from the initial substrate on which it has been epitaxied, relaxes thanks to the viscosity of a support substrate on which it has been transferred and after the initial substrate has been eliminated. This relaxation takes place through formation of surface wrinkles. However, the relaxation through wrinkles may have major drawbacks. Depending on their amplitude and their wavelength, it may lead to a surface roughening of the epitaxial layer on account of the non-homogeneous deformation field that it generates on the surface of the material. A technique for eliminating these wrinkles therefore needs to be developed.

DESCRIPTION OF THE INVENTION

The present invention has been conceived with the aim of eliminating the wrinkles brought about during the relaxation of a strained thin film.

It consists in a method for relaxing a strained thin film, secured via a first main face of an initial support, the second main face of the thin film being known as the contact face, the method comprising the following successive steps:

supplying an intermediate support comprising a polymer layer having a free main face known as the contact face, the thermal expansion coefficient of the polymer being greater than that of the thin film, adhesively bringing into contact the contact face of the strained thin film with the contact face of the polymer layer, eliminating the initial support, thereby provoking the relaxation of the thin film through formation of wrinkles and revealing the first main face of the thin film, increasing the temperature of the polymer layer in order to stretch the relaxed thin film and eliminate the wrinkles, securing the first main face of the thin film with one face of a receiving substrate, eliminating the intermediate support to obtain a relaxed thin film integral with the receiving substrate.

According to a preferred embodiment, the step of supplying an intermediate support comprises the deposition of a layer of said polymer in the liquid state on a substrate, then its polymerisation. The deposition of the polymer layer may take place on one face of the substrate covered with a superficial film of resin. The polymer in the liquid state may be deposited on one face of the substrate comprising spacers for positioning the layer of said polymer. The positioning spacers may be formed in the same polymer as that of the polymer layer.

Advantageously, the polymer layer in the liquid state deposited on said substrate is planarised by bringing into contact the free face of the polymer layer in the liquid state with a face of a planarisation substrate. The face of the planarisation substrate may comprise a film of resin. The planarisation substrate may be eliminated after the polymerisation. The elimination of the planarisation substrate may be carried out by separation by means of a blade inserted between the polymer layer and the planarisation substrate.

According to one embodiment, the contact face of the strained thin film and the contact face of the polymer layer are brought into adhesive contact through polymerisation of a film of polymer interposed between the contact faces or by molecular bonding.

The initial support may be eliminated chemically or mechanically.

According to one specific embodiment, the securing of the first main face of the thin film with one face of a receiving substrate is carried out by molecular bonding.

The elimination of the intermediate support may be carried out by firstly eliminating the substrate from the intermediate support, then by eliminating the polymer layer. The substrate of the intermediate support may be eliminated by separation by means of a blade inserted between itself and the polymer layer. The polymer layer may be eliminated mechanically or chemically.

The strained thin film may be a layer in a first semi-conductor material obtained by hetero-epitaxy on an initial support in a second semi-conductor material.

BRIEF DESCRIPTION OF DRAWINGS

The invention will be better understood and other advantages and particularities will become clear on reading the description provided hereafter, given solely by way of indication and in no way limiting, and by referring to the appended figures constituted of FIGS. 1A to 1G, which are transversal sectional views illustrating an embodiment of the method according to the invention.

DETAILED DESCRIPTION OF SPECIFIC EMBODIMENTS

In the embodiment that will now be described, the polymer used is polydimethylsiloxane or PDMS. However, any other polymer having similar properties may be used. The required properties are a sufficient flexibility to obtain the relaxation of the strained layer, even for a polymer layer of high thickness, and a thermal expansion coefficient sufficiently greater than that of the material constituting the strained layer. The polymer layer enables the relaxation stresses of the strained layer that will be secured to it thereby to be absorbed.

Figure 1A:
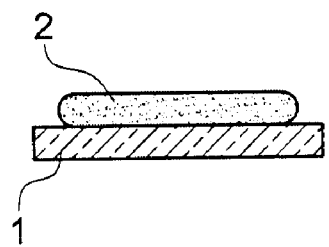

FIG. 1A represents a first substrate 1, for example in silicon, on which has been deposited a layer of PDMS 2 in the liquid state. As an alternative, it is provided to cover the first substrate with a layer of resin to facilitate the subsequent removal of the first substrate. Since the polymer is a viscous material in the liquid state, the spreading takes place spontaneously. The polymer may also be deposited in several stages by means of a spin coater.

Figure 1B:
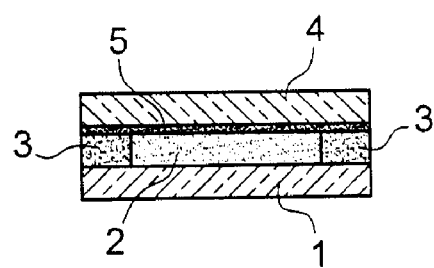

In order to obtain a good homogeneity of the polymer layer, it is preferable, prior to its deposition, to position spacers on the surface of the substrate 1 in order to better control the thickness of the deposited polymer. Said spacers, for example pads regularly spread out on the surface of the substrate 1, are represented in FIG. 1B under reference 3. They may be in any appropriate material. However, the use of spacers in PDMS, already polymerised, enables them to be encompassed in the polymer layer 2.

A second substrate, for example in silicon, having a face of very good planeness is then used. A thin layer (or film) of resin 5 may be deposited on the face of very good planeness of the second substrate. The second substrate, referenced 4 in FIG. 1B, is then deposited on the spacers 3 in order to homogenise in thickness the polymer layer 2, the layer of resin 5 being in contact with the polymer layer 2. The layer of resin 5 serves to facilitate the removal of the substrate 4 once, in a subsequent step, the layer of PDMS 2 has been polymerised.

Then, the polymerisation of the polymer of the layer 2 is carried out by means of an annealing. The polymerisation takes place by means of a precursor mixed with the polymer. It may take place at different temperatures, for example at room temperature for 48 hours or at 150° C. for 10 minutes.

The substrate 4 is then removed, for example by inserting a blade between the substrate 4 and the polymerised layer 2. The layer of resin 5 facilitates the disbanding of the substrate 4. A structure, known as intermediate support, is obtained comprising the substrate 1 supporting the polymer layer 2. It is possible as an alternative also to remove the substrate 1, for example by inserting a blade between the substrate 1 and the polymerised layer 2. The PDMS then assures on its own the mechanical strength necessary for the continuation of the method. This is possible if this layer of PDMS is sufficiently thick (around a mm).

Figure 1C:
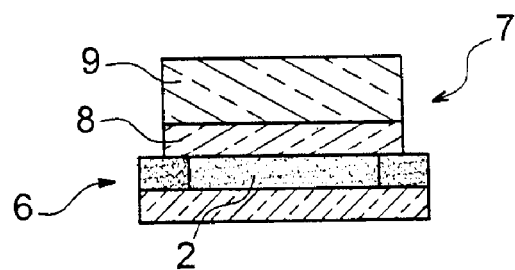

The intermediate support, referenced 6 (see FIG. 1C), then receives a structure 7 comprising a fine strained layer 8 epitaxied on a third substrate 9 (III-V semi-conductor or other), wherein the strained layer 8 is facing the polymer layer 2. The structure 7 is rendered secure with the intermediate support 6. The securing may be obtained by polymerisation of a film of polymer deposited beforehand on the strained layer. It may also be obtained by molecular bonding.

Figure 1D:
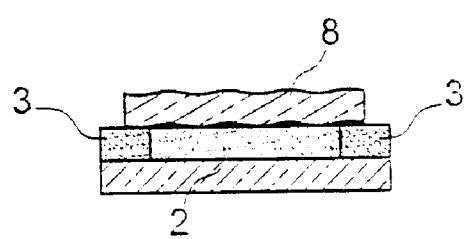

The substrate 9 is then eliminated. The elimination may be obtained chemically (through selective dry or wet etching) or mechanically. Barrier layers may advantageously have been provided for between the substrate 9 and the strained layer 8 to facilitate the elimination of the substrate 9. The strained layer 8 then relaxes on the polymer layer 2 and on the spacers 3 in the example represented. This relaxation takes place through formation of wrinkles (see FIG. 1D). Reference may be made in this respect to the article of S. PERICHON LACOUR et al., entitled "Stretchable gold conductors on elastomeric substrates", Appl. Phys. Lett., Vol. 82, No. 15, 14 Apr. 2003, pages 2404 to 2406.

Figure 1E:
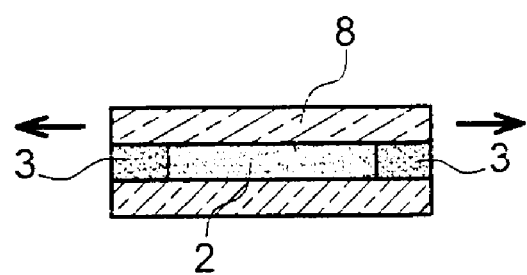

The following step of the method according to the invention is based on the fact that the coefficient of expansion of the polymer is sufficiently greater than that of the strained layer. The temperature of the polymer is raised, for example by placing the assembly illustrated by FIG. 1D on a heating plate at an adequate temperature so that the expansion of the PDMS carries along the wrinkled strained layer 8. This then becomes stretched, thereby eliminating the wrinkles (see FIG. 1E).

Figure 1F:
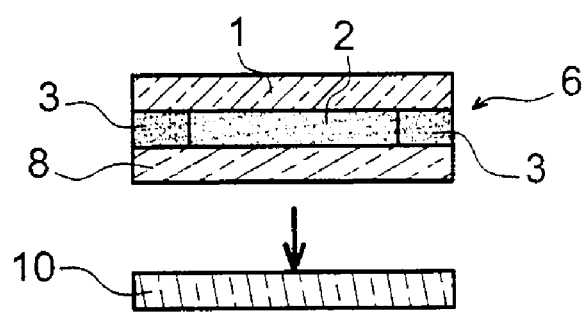

A fourth substrate 10, of standard type (in silicon for example or in surface oxidised silicon), is bonded onto the now stretched layer 8. The bonding may be a molecular bonding (see FIG. 1F). The temperature is advantageously maintained during this bonding in order to avoid the return of the wrinkles in the case of cooling. The bonding of the substrate 10 onto the layer 8 enables the stretched layer 8 to be maintained during cooling.

Figure 1G:
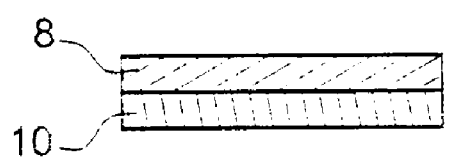

The intermediate support 6 is removed. In order to obtain this result, the substrate 1, if it is still present, may firstly be removed, for example by insertion of a blade between the substrate 1 and the polymer forming the layer 2 and the spacers 3. The polymer may then be eliminated mechanically or chemically, by selective dry or humid etching. A relaxed layer 8, without wrinkles, is obtained ready for a resumption of epitaxy and transferred onto a standard substrate 10 (see FIG. 1G).

The layer of PDMS may have a thickness of around the millimeter (typically 2 mm). The strained layer 8 may be constituted of InGaAs, compressively strained to 0.8% on a InP substrate 9. This strained layer may have been obtained by molecular jet epitaxy of a layer of 30 nm thickness of $In_{0.65}Ga_{0.35}As$ on a InP substrate. The thickness of InGaAs must remain below the critical thickness, the thickness from which the layer of InGaAs relaxes (by forming dislocations, etc.). Advantageously, between the strained layer of InGaAs and the InP substrate are provided barrier layers conserving the lattice parameter of InP for example, by stacking on InP, a layer of $In_{0.53}Ga_{0.47}As$ and a layer of InP (each barrier layer typically having a thickness of around 200 nm). The thickness of the layer 8 may be around a hundred Å, for example 30 nm to obtain a compressive strain of 0.8%. The thickness depends on the strain. The layer 8 may be bonded to the intermediate support 6, for example the layer of PDMS (2 mm) obtained after removal of the substrates 1 and 4, by means of a thin film of PDMS of several tens of μm thickness (for example 40 μm), deposited by spin coater on the strained layer. This bonding film may also be polymerised at room temperature for 48 hours. In order to obtain the relaxation, the substrate 9 in InP may be chemically etched in a selective manner by means of a solution of HCl if barrier layers of InGaAs and InP have been used. The InP substrate is selectively etched in a solution of $HCl:H_2O$ (3:1), then the layer of InGaAs in a solution of $H_2SO_4:H_2O_2:H_2O$ (1:1:10), then the barrier layer of InP with the same solution as that used to etch the InP substrate.

In the case of a layer of InGaAs compressively strained to 0.8%, the temperature necessary for the expansion of the polymer to obtain a layer without wrinkles is around 150° C. The PDMS may be heated for example by means of a heating plate. The layer of InGaAs 8, once the wrinkles have been eliminated, may be transferred onto a host substrate for example by molecular bonding. Since the bonding forces between the relaxed layer of InGaAs 8 and the host substrate are stronger than those between the polymer and the relaxed layer 8, the PDMS adhering to the layer 8 may be removed by simple peeling.

The invention claimed is:

1. A method for relaxing a strained thin film, comprising:
   obtaining the strained thin film, which is secured via a first main face to an initial support, a second main face of the strained thin film being a contact face;
   supplying an intermediate support including a polymer layer having a main free contact face, wherein thermal expansion coefficient of the polymer is greater than that of the strained thin film;
   adhesively bringing into contact the contact face of the strained thin film with the contact face of the polymer layer;
   provoking relaxation of the strained thin film through formation of wrinkles in the strained thin film by eliminating the initial support and revealing the first main face of the strained thin film;
   increasing temperature of the polymer layer;
   stretching the wrinkled thin film and eliminating the wrinkles created during the provoking while the temperature of the polymer layer is increased;
   securing, while the wrinkles are eliminated in the thin film, the first main face of the thin film with one face of a receiving substrate; and
   eliminating the intermediate support and obtaining a relaxed thin film integral with the receiving substrate.

2. The method according to claim 1, wherein the supplying the intermediate support comprises depositing a layer of the polymer in a liquid state on a substrate, and then performing polymerization.

3. The method according to claim 2, wherein the depositing includes depositing the layer of the polymer on one face of the substrate covered with a superficial film of resin.

4. The method according to claim 2, wherein the depositing includes depositing the layer of the polymer in the liquid state on one face of the substrate including positioning spacers for the layer of the polymer.

5. The method according to claim 4, wherein the positioning spacers are formed in a same polymer as that of the polymer layer.

6. The method according to claim 4, wherein the method further comprises:
   planarizing the polymer layer in the liquid state deposited on the substrate by bringing into contact a free face of the polymer layer in the liquid state with a face of a planarization substrate.

7. The method according to claim 6, wherein the face of the planarization substrate includes a film of resin.

8. The method according to claim 6, wherein the method further comprises eliminating the planarization substrate after the polymerization.

9. The method according to claim 8, wherein the eliminating includes inserting a blade between the polymer layer and the planarization substrate and separating the polymer layer and the planarization substrate using the blade.

10. The method according to claim 2, wherein the method comprises eliminating the substrate after polymerization.

11. The method according to claim 1, wherein the polymer of the polymer layer is polydimethylsiloxane (PDMS).

12. The method according to claim 1, wherein adhesively bringing comprises bringing the contact face of the strained thin film and the contact face of the polymer layer into adhesive contact by polymerization of a film of polymer interposed between the contact faces or by molecular bonding.

13. The method according to claim 1, wherein the initial support is eliminated chemically or mechanically.

14. The method according to claim 1, wherein the securing the first main face of the thin film with the one face of the receiving substrate is carried out by molecular bonding.

15. The method according to claim 1, wherein the eliminating the intermediate support is carried out by eliminating firstly a substrate of the intermediate support, then by eliminating the polymer layer.

16. The method according to claim 15, wherein the substrate of the intermediate support is eliminated by separation with a blade inserted between the substrate of the intermediate support and the polymer layer.

17. The method according to claim 15, wherein the polymer layer is eliminated mechanically or chemically.

18. The method according to claim 1, wherein the strained thin film is a layer in a first semi-conductor material obtained by hetero-epitaxy on the initial support in a second semi-conductor material.

* * * * *

UNITED STATES PATENT AND TRADEMARK OFFICE
CERTIFICATE OF CORRECTION

| | | |
|---|---|---|
| PATENT NO. | : 7,981,238 B2 | Page 1 of 1 |
| APPLICATION NO. | : 12/158178 | |
| DATED | : July 19, 2011 | |
| INVENTOR(S) | : Lea Di Cioccio et al. | |

It is certified that error appears in the above-identified patent and that said Letters Patent is hereby corrected as shown below:

On the title page, Item (87), the PCT Pub. information is incorrect. Item (87) should read:

-- (87)  PCT Pub. No.:     WO2007/074153
         PCT Pub. Date:    Jul. 05, 2007 --

Signed and Sealed this
Twentieth Day of September, 2011

David J. Kappos
*Director of the United States Patent and Trademark Office*